(12) United States Patent
Amin et al.

(10) Patent No.: US 7,880,568 B2
(45) Date of Patent: Feb. 1, 2011

(54) EQUALIZER SYSTEM HAVING A TUNABLE ACTIVE INDUCTOR

(75) Inventors: Arif A. Amin, Fremont, CA (US);
Baoqing Huang, Saratoga, CA (US);
Waseem Ahmad, Union City, CA (US);
Dawei Huang, San Diego, CA (US);
Drew George Doblar, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 806 days.

(21) Appl. No.: 11/856,147

(22) Filed: Sep. 17, 2007

(65) Prior Publication Data

US 2009/0074048 A1 Mar. 19, 2009

(51) Int. Cl.
*H03H 11/48* (2006.01)
(52) U.S. Cl. ........................ 333/214; 375/229
(58) Field of Classification Search ............ 333/214, 333/304, 18, 28 R; 375/230, 229, 257, 233, 375/142, 232, 340
See application file for complete search history.

(56) References Cited

U.S. PATENT DOCUMENTS 7,154,945 B2 * 12/2006 Guinea et al. ............... 375/229
7,289,557 B2 * 10/2007 Balamurugan et al. ...... 375/232

OTHER PUBLICATIONS

Markus Grozing, Andreas Pascht, Manfred Berroth, A 2.5 V CMOS Differential Active Inductor With Tunable L and Q For Frequencies Up To 5 GHZ, 2001 IEEE Radio Frequency Integrated Circuits Symposium, pp. 271-274.

* cited by examiner

*Primary Examiner*—Lam T Mai
(74) *Attorney, Agent, or Firm*—Brooks Kushman P.C.

(57) ABSTRACT

An linear equalizer system for a transmission channel includes an active inductor with a tunable inductance and quality factor. The active inductor includes a transconducting element. A current steering digital to analog converter controls the flow of a bias current through the transconducting element to tune the active inductor.

20 Claims, 10 Drawing Sheets

US 7,880,568 B2

EQUALIZER SYSTEM HAVING A TUNABLE ACTIVE INDUCTOR

BACKGROUND

1. Field of the Invention

The invention relates to equalizer systems having tunable active inductors.

2. Discussion

Inter-chip transmission signals may be subject to channel losses at high data rates. These losses may degrade signal quality. Linear equalizers may be implemented to compensate for such losses.

A linear equalizer may be tunable. This tunability may be achieved via passive components and low resistance switches. For example, bandwidth tuning may be achieved using passive inductors. Such inductors, however, occupy significant chip area. Gain tuning may be achieved using resistors and capacitors. Such resistors and capacitors, however, also occupy significant chip area.

SUMMARY

Embodiments of the invention provide a linear equalizer having a tunable active inductor. The tunable active inductor includes a transconducting element and a current steering device. The current steering device selectively controls the flow of bias current through the transconducting element. This selective control of the bias current alters the inductance and/or quality factor of the tunable active inductor.

DETAILED DESCRIPTION

Embodiments of the invention may provide a high bandwidth, low power equalization amplifier. This amplifier may, for example, compensate for channel loss at data rates of 12.5 GBps and drive a 300 fF load at output. Digital to analog converters may be used to achieve active tuning.

Figure 1:
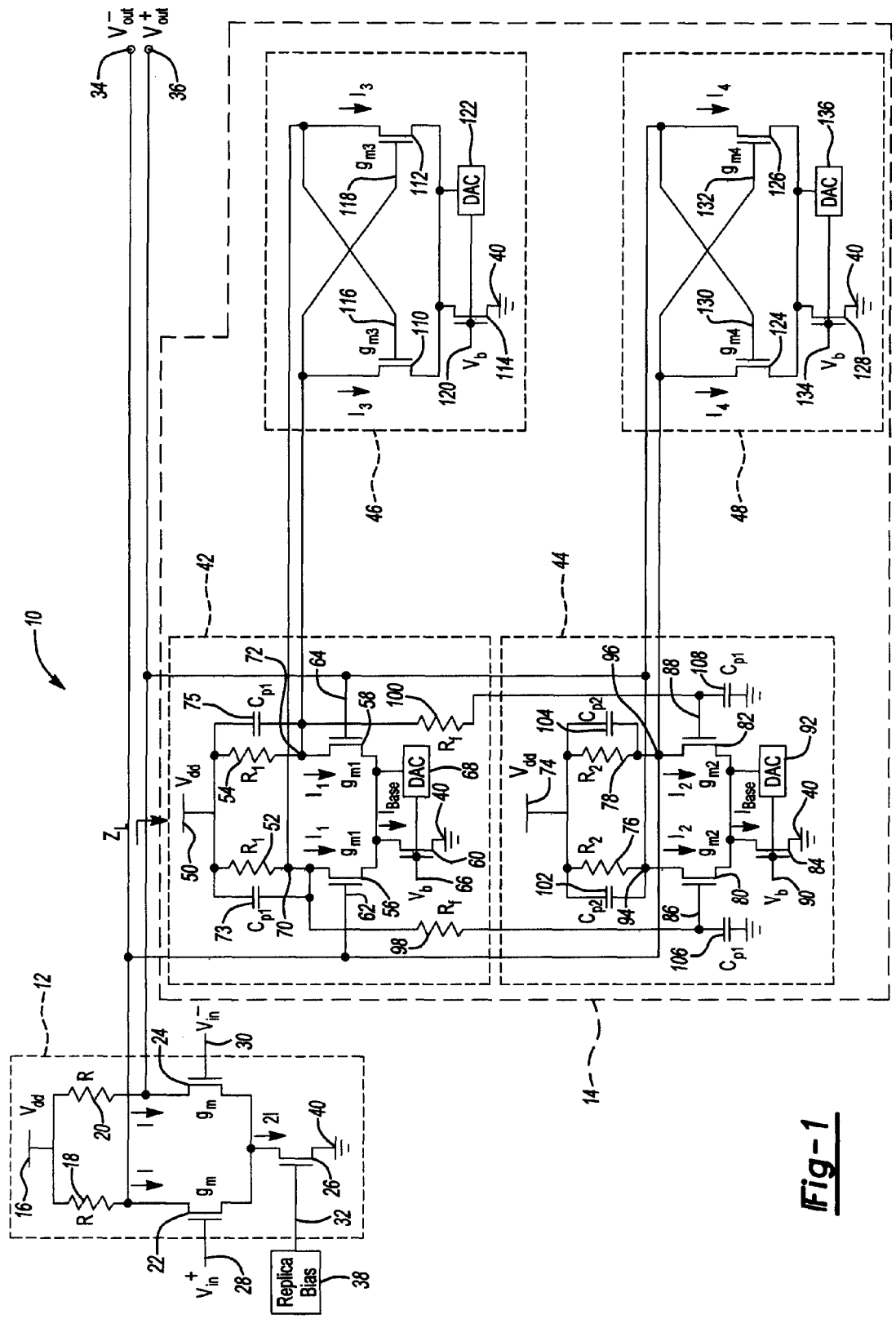
FIG. 1 is a schematic diagram of an example linear equalizer system.

FIG. 1 is a schematic diagram of an example linear equalizer system. Linear equalizer system 10 includes amplifier 12 and active inductor 14. Amplifier 12 includes power input 16, e.g., $V_{dd}$, resistors 18, 20, e.g., R, transistors 22, 24, 26, e.g., NMOS transistors, differential voltage inputs 28, 30, bias voltage input 32, and differential voltage outputs 34, 36. Power input 16 is electrically connected with a power supply (not shown). Bias voltage input 32 is electrically connected with Replica Bias 38. Bias voltage input 32 receives a bias voltage from Replica Bias 38. This bias voltage activates the gate of transistor 26 such that transistor 26 saturates and allows current, e.g., 21, to flow to ground 40. Differential voltage inputs 28, 30 receive a differential voltage, e.g., $V_{in}^+$, $V_{in}^-$, from a transmitter (not shown). This differential voltage activates the gates of transistors 22, 24 such that transistors 22, 24 saturate and allow current, e.g., I, to flow from power input 16 to transistor 26. The operation of amplifier 12 produces a differential voltage, e.g., $V_{out}^-$, $V_{out}^+$, at differential voltage outputs 34, 36 respectively.

Active inductor 14 amplifies certain frequency components, relative to others, of the signal carried by $V_{out}^-$, $V_{out}^+$. Active inductor 14 includes first transconducting element (1TE) 42, second transconducting element (2TE) 44, third transconducting element (3TE) 46, and fourth transconducting element (4TE) 48.

1TE 42 includes power input 50, e.g., $V_{dd}$, resistors, 52, 54, e.g., R1, transistors 56, 58, 60, e.g., NMOS transistors, differential voltage inputs 62, 64, bias voltage input 66, DAC 68, and differential voltage outputs 70, 72. Power input 50 is electrically connected with a power supply (not shown). Bias voltage input 66 is electrically connected with a bias voltage, e.g., $V_b$. This bias voltage activates the gate of transistor 60 such that transistor 60 saturates and allows current, $I_{base}$, to flow to ground 40.

Differential voltage inputs 62, 64 are electrically connected with differential voltage outputs 34, 36 respectively of amplifier 12. Differential voltage inputs 62, 64 thus receive a differential voltage, e.g., $V_{out}^-$, $V_{out}^+$, from amplifier 12. This differential voltage activates the gates of transistors 56, 58 such that transistors 56, 58 saturate and allow current, e.g., $I_1$, to flow from power input 50 to transistor 60 and, as explained below, DAC 68. DAC 68 alters the inductance of active inductor 14. Parasitic capacitances associated with 1TE 42 are represented as capacitors 73, 75.

2TE 44 includes power input 74, e.g., $V_{dd}$, resistors 76, 78, e.g., R2, transistors 80, 82, 84, e.g., NMOS transistors, differential voltage inputs 86, 88, bias voltage input 90, DAC 92, and differential voltage outputs 94, 96. Power input 74 is electrically connected with a power supply (not shown). Bias voltage input 90 is electrically connected with a bias voltage, e.g., $V_b$. This bias voltage activates the gate of transistor 84 such that transistor 84 saturates and allows current, $I_{base}$, to flow to ground 40. Differential voltage inputs 86, 88 are electrically connected with differential voltage outputs 70, 72 respectively of 1TE 42 through series resistors 98, 100, e.g., $R_f$, respectively. As explained below, series resistors 98, 100 alter the quality factor of active inductor 14.

The differential voltage received from 1TE 42 by differential voltage inputs 86, 88 activates the gates of transistors 80, 82 such that transistors 80, 82 saturate and allow current, e.g., $I_2$, to flow from power input 74 to transistor 84 and DAC 92. Parasitic capacitances associated with 2TE are represented as capacitors 102, 104, 106, 108.

3TE 46 includes transistors 110, 112, 114, e.g., NMOS transistors, differential voltage inputs 116, 118, bias voltage input 120, and DAC 122. Bias voltage input 120 is electrically connected with a bias voltage, e.g., $V_b$. This bias voltage activates the gate of transistor 114 such that transistor 114 saturates and allows current to flow to ground 40.

Differential voltage inputs 116, 118 are electrically connected with differential voltage outputs 70, 72 respectively of 1TE 42. The differential voltage received from 1TE 42 by differential voltage inputs 116, 118 activates the gates of transistors 110, 112 such that transistors 110, 112 saturate and allow current, e.g., $I_3$, to flow to transistor 114 and DAC 122. The drains of transistors 110, 112 are electrically connected with differential voltage outputs 72, 70 respectively of 1TE 42. As explained below, 3TE 46 alters the inductance and quality factor of active inductor 14.

4TE 48 includes transistors 124, 126, 128, e.g., NMOS transistors, differential voltage inputs 130, 132, bias voltage input 134, and DAC 136. Bias voltage input 134 is electrically connected with a bias voltage, e.g., $V_b$. This bias voltage activates the gate of transistor 128 such that transistor 114 saturates and allows current to flow to ground 40.

Differential voltage inputs 130, 132 are electrically connected with differential voltage outputs 94, 96 respectively of 2TE 44. The differential voltage received from 2TE 44 by differential voltage inputs 130, 132 activates the gates of transistors 124, 126 such that transistors 124, 126 saturate and allow current, e.g., $I_4$, to flow to transistor 128 and DAC 126. The drains of transistors 124, 126 are electrically connected with differential voltage outputs 96, 94 respectively of 2TE 44. As explained below, 4TE 48 alters the inductance and quality factor of active inductor 14.

Table 1 lists example values for some of the components of FIG. 1:

TABLE 1

| | |
|---|---|
| $R_{18/20}$ = 60 ohms | $L_{110/112}$ = 0.1 microns |
| $W_{22/24}$ = 220 microns | $W_{114}$ = 20 microns |
| $L_{22/24}$ = 0.1 microns | $L_{114}$ = 0.25 microns |
| $W_{26}$ = 240 microns | $W_{124/126}$ = 60 microns |
| $L_{26}$ = 0.25 microns | $L_{124/126}$ = 0.1 microns |
| $R_{1\ 52/54}$ = 800 ohms | $W_{128}$ = 20 microns |
| $W_{56/58}$ = 100 microns | $L_{128}$ = 0.25 microns |
| $L_{56/58}$ = 0.1 microns | I ≅ 4 mA |
| $W_{60}$ = 40 microns | $I_1$ ≅ 200 μA |
| $L_{60}$ = 0.25 microns | $I_2$ ≅ 400 μA |
| $W_{84}$ = 80 microns | $I_3$ ≅ 60 μA |
| $L_{84}$ = 0.25 microns | $I_4$ ≅ 60 μA |
| $W_{80/82}$ = 100 microns | $g_m$ ≅ 0.03 mho |
| $L_{80/82}$ = 0.1 microns | $g_{m1}$ ≅ 0.001 mho |
| $R_{2\ 76/78}$ = 600 ohms | $g_{m2}$ ≅ 0.002 mho |
| $R_f$ = 280 ohms | $g_{m3}$ ≅ 0.0005 mho |
| $W_{110/112}$ = 60 microns | $g_{m4}$ ≅ 0.0005 mho |

Figure 2:
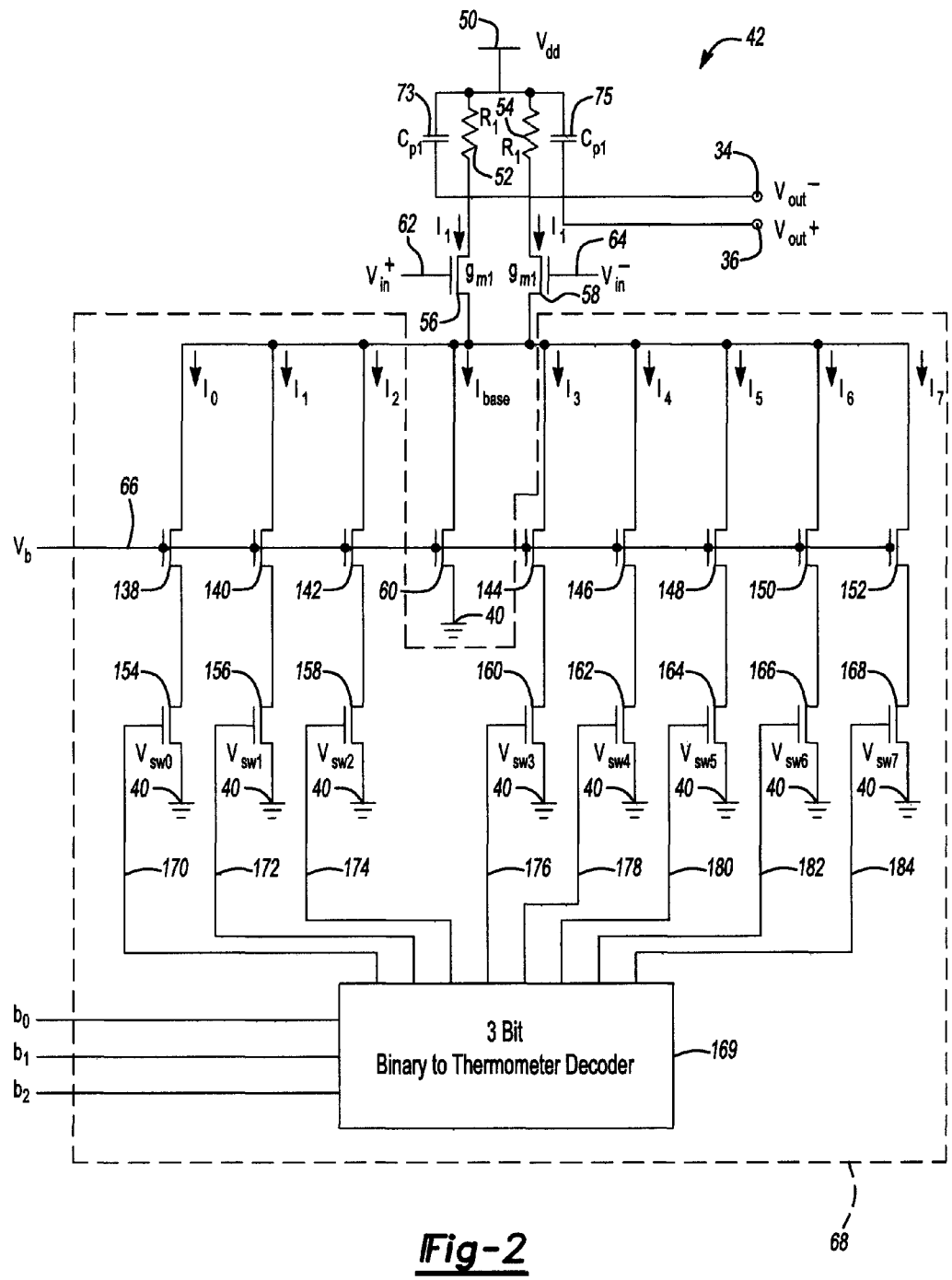
FIG. 2 is a schematic diagram of a first portion of the active inductor of FIG. 1.

FIG. 2 is a schematic diagram of a first portion of the active inductor of FIG. 1. DAC 68 of 1TE 42 includes transistors 138-152, e.g., NMOS transistors, transistors 154-168, e.g., NMOS transistors, and thermometer decoder 169, e.g., 3 bit binary to thermometer decoder. Thermometer decoder 169 receives a 3 bit input via $b_0$, $b_1$, and $b_2$ and, depending on the input, outputs corresponding voltages, e.g., $V_{sw0}$-$V_{sw7}$, via voltage outputs 170-184.

The drains of transistors 138-152 are electrically connected in parallel with the drain of transistor 60. The drains of transistors 154-168 are electrically connected with the sources of transistors 138-152 respectively. The sources of transistors 154-168 are electrically connected with ground 40. The gates of transistors 138-152 are electrically connected with bias voltage input 66. Bias voltage input 66 is electrically connected with a bias voltage, e.g., $V_b$. This bias voltage activates the gates of transistors 138-152 such that transistors 138-152 saturate. The gates of transistors 154-168 are electrically connected with voltage outputs 170-184 respectively of thermometer decoder 169. DAC 68 can thus selectively allow currents $I_0$-$I_7$ to flow to ground 40 by selectively producing voltages $V_{sw0}$-$V_{sw7}$. Equations (1)-(5) develop the relationship between the current and transconductance of 1TE 42:

$$I_{base} + \sum_{i=o}^{N} I_i = 2I_1 \tag{1}$$

$$I_1 = \frac{1}{2}\left[I_{base} + \sum_{i=o}^{N} I_i\right], \begin{bmatrix} N_{max} = 2^3 - 1 = 7 \\ N_{min} = 0 \end{bmatrix} \tag{2}$$

$$g_{m1_i} = \sqrt{2\beta_1 I_1} = \sqrt{2\mu_n C_{ox} \cdot \frac{W_1}{L_1} I_1} \tag{3}$$

$$g_{m1_i} = \sqrt{2\mu_n C_{ox} \frac{W_1}{L_1} \cdot \frac{1}{2}\left[I_{base} + \sum_{i=0}^{N} I_i\right]} \; [i = 0 \ldots 7] \tag{4}$$

$$g_{m1_i} = \sqrt{\mu_n C_{ox} \frac{W_1}{L_1}\left(I_{base} + \sum_{i=0}^{N} I_i\right)} \; [i = 0 \ldots 7] \tag{5}$$

where
$g_{m1_i}$=transconductance of transistors 56, 58
$\mu_n$=mobility of electrons
$C_{ox}$=NMOS transistor gate oxide capacitance
$W_1$=width of transistors 56, 58
$L_1$=length of transistors 56, 58

Figure 3:
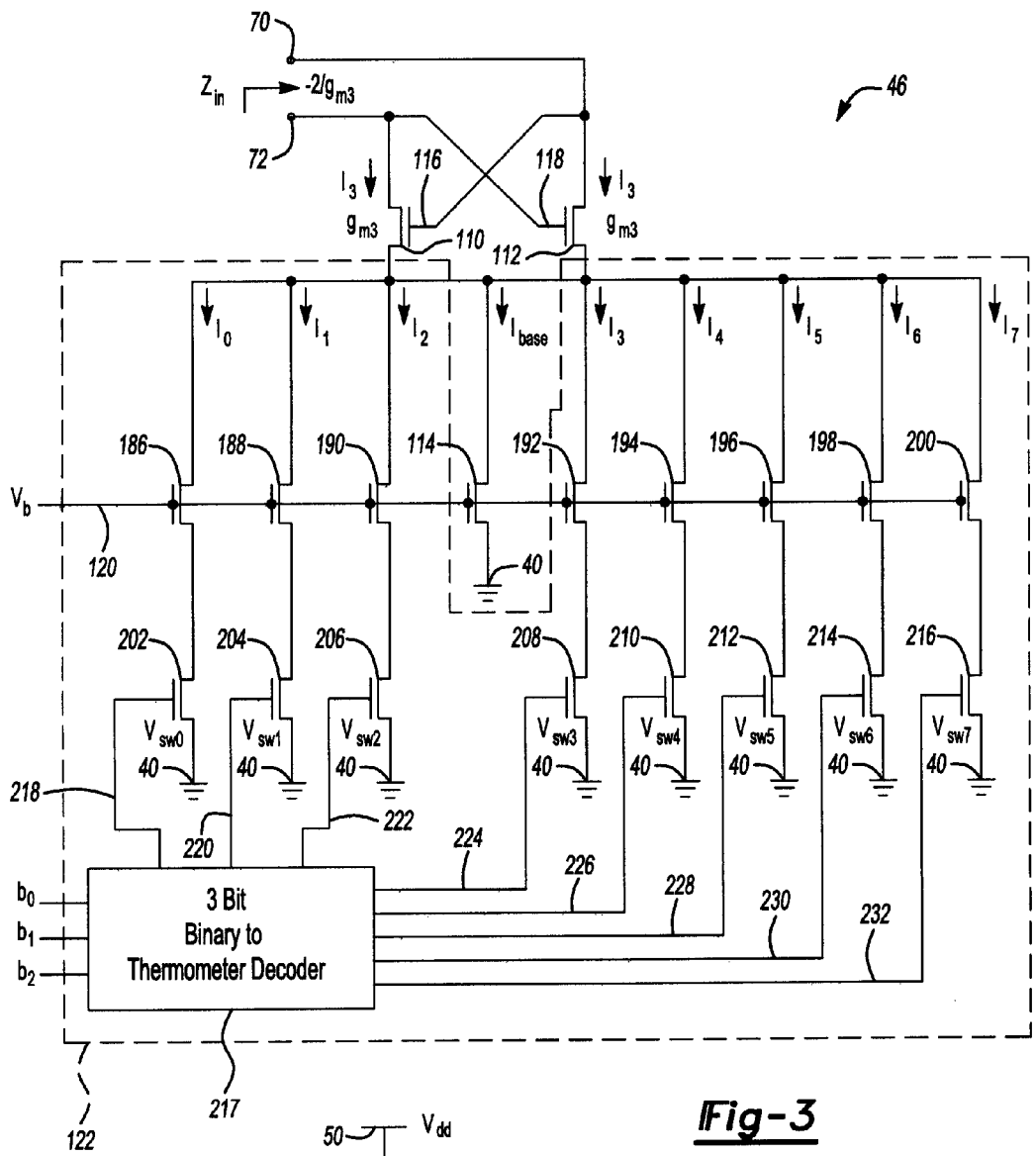
FIG. 3 is a schematic diagram of a second portion of the active inductor of FIG. 1.

FIG. 3 is a schematic diagram of a second portion of the active inductor of FIG. 1. DAC 122 includes transistors 186-200, transistors 202-216, and thermometer decoder 217. DAC 122 is configured similarly to DAC 68. DAC 122 can thus selectively allow currents $I_0$-$I_7$ to flow to ground 40 by selectively producing voltages $V_{sw0}$-$V_{sw7}$. Equations (6)-(8) develop the relationship between the current and transconductance of 3TE 46:

$$g_{m3_i} = \sqrt{2\mu_n C_{ox} \frac{W_3}{L_3} \cdot I_3} \tag{6}$$

$$g_{m3_i} = \sqrt{2\mu_n C_{ox} \frac{W_3}{L_3} \cdot \frac{1}{2}\left(\sum_{i=0}^{N} I_i + I_{base}\right)} \tag{7}$$

$$g_{m3_i} = \sqrt{\mu_n C_{ox} \frac{W_3}{L_3}\left(\sum_{i=0}^{N} I_i + I_{base}\right)} \; [i = 0 \ldots 7], \begin{bmatrix} N_{max} = 2^3 - 1 = 7 \\ N_{min} = 0 \end{bmatrix} \tag{8}$$

where
$g_{m3_i}$=transconductance of transistors 110, 112
$\mu_n$=mobility of electrons
$C_{ox}$=NMOS transistor gate oxide capacitance
$W_3$=width of transistors 110, 112
$L_3$=length of transistors 110, 112

Figure 4:
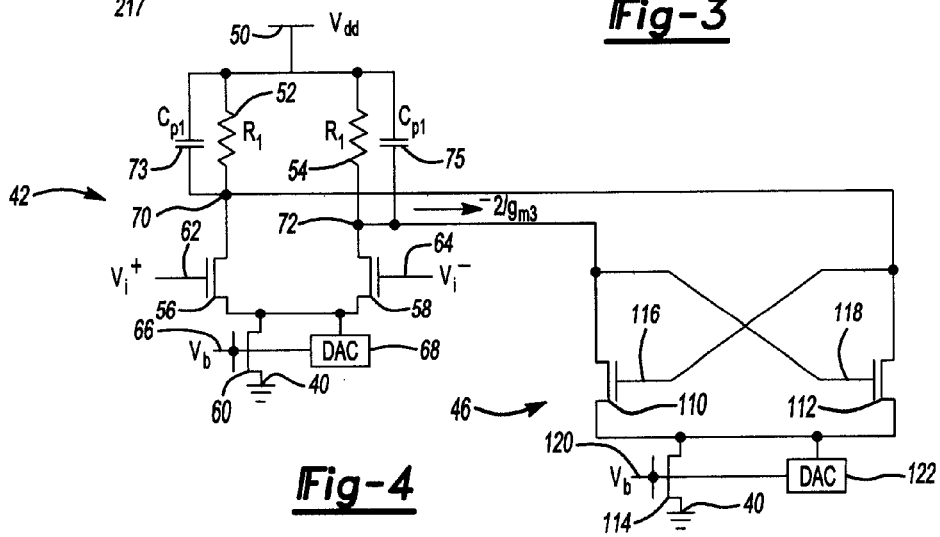
FIG. 4 is a schematic diagram of the first portion of FIG. 2 and the second portion of FIG. 3.

FIG. 4 is a schematic diagram of the first portion of FIG. 2 and the second portion of FIG. 3. The equivalent transconductance of 3TE 46 is shown to be equal to $-2/g_{m3}$.

Figure 5A:
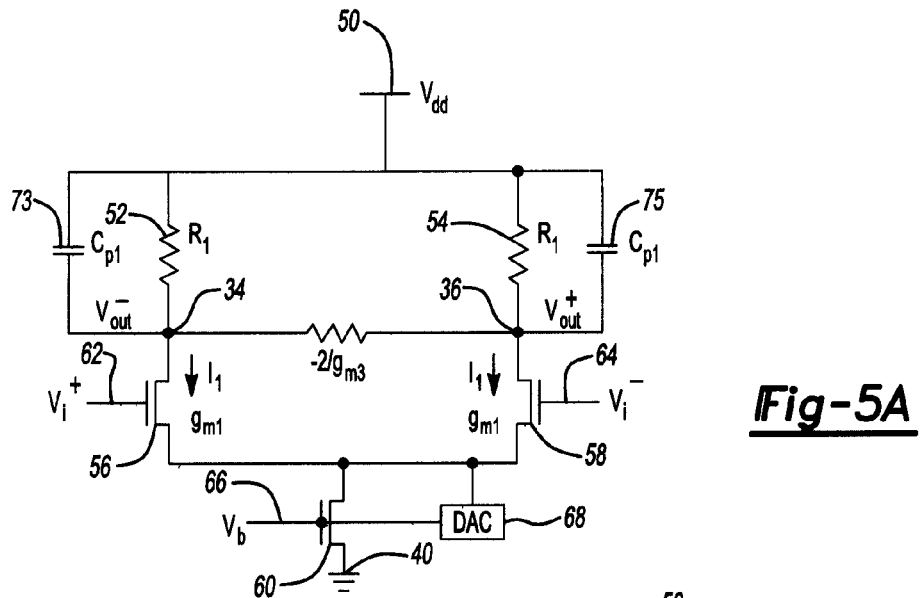
FIGS. 5A-5C are schematic diagrams of a progression of example equivalent representations of the circuit of FIG. 4.
Figure 5B:
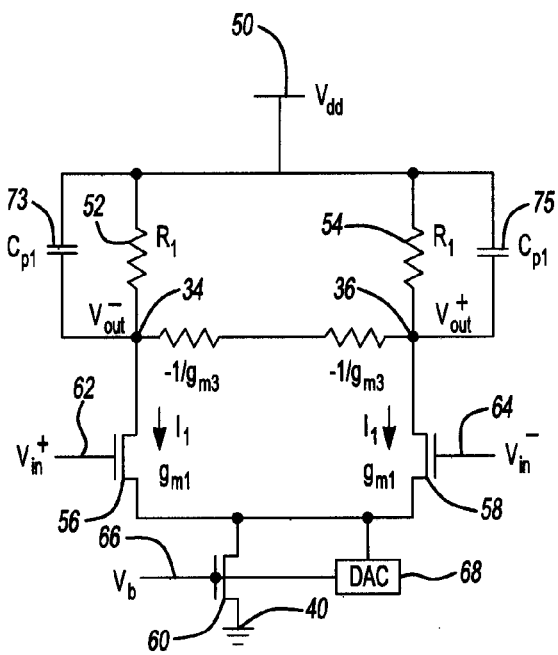
Figure 5C:
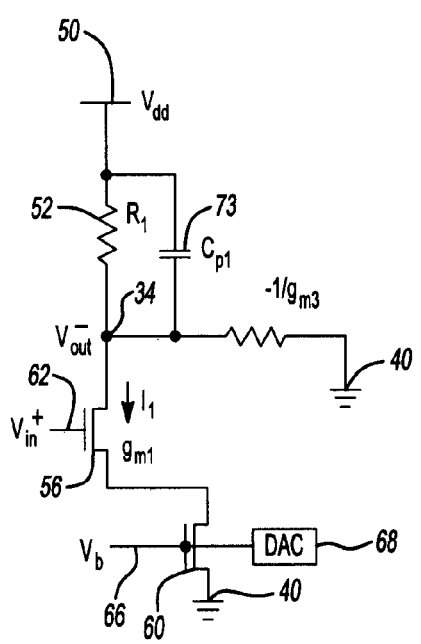

FIGS. 5A-5C are schematic diagrams of a progression of equivalent representations of the circuit of FIG. 4. Using the half-circuit approach, the effective transconductance of 1TE 42 and 3TE 46 can be determined from FIG. 5C and equations (9)-(15):

$$\frac{V_{out}}{V_{in}} = g_{m1_i}\left(Z_L \| -\frac{1}{g_{m3_i}}\right) \quad (9)$$

$$= g_{m1_i}\frac{-Z_L/g_{m3_i}}{R_L - \frac{1}{g_{m3_i}}} \quad (10)$$

$$= g_{m1_i}\frac{Z_L}{1 - g_{m3_i}Z_L} \quad (11)$$

where $$Z_L = R_1 \| \frac{1}{sC_{p1}} = \frac{R_1\frac{1}{sC_{p1}}}{R_1 + \frac{1}{sC_{p1}}} = \frac{R_1}{1 + sC_{p1}R_1} \quad (12)$$

The output current can be determined as $$i_{out} = V_{out}/Z_L \quad (13)$$

$$i_{out} = V_{in}g_{m1_i}\frac{Z_L}{1 - g_{m3_i}Z_L} \cdot \frac{1}{Z_L} = \frac{V_{in}g_{m1_i}}{1 - g_{m3_i}Z_L} \quad (14)$$

The effective transconductance of 1TE 42 and 3TE 46 is given by $$g_{m1_{i(eff)}} = \frac{i_{out}}{V_{in}} = \frac{g_{m1_i}}{1 - g_{m3_i}Z_L} \quad (15)$$

Similarly, it can be shown that 2TE 44 and 4TE 48 have an effective transconductance $g_{m2_{i(eff)}}$.

Figure 6:
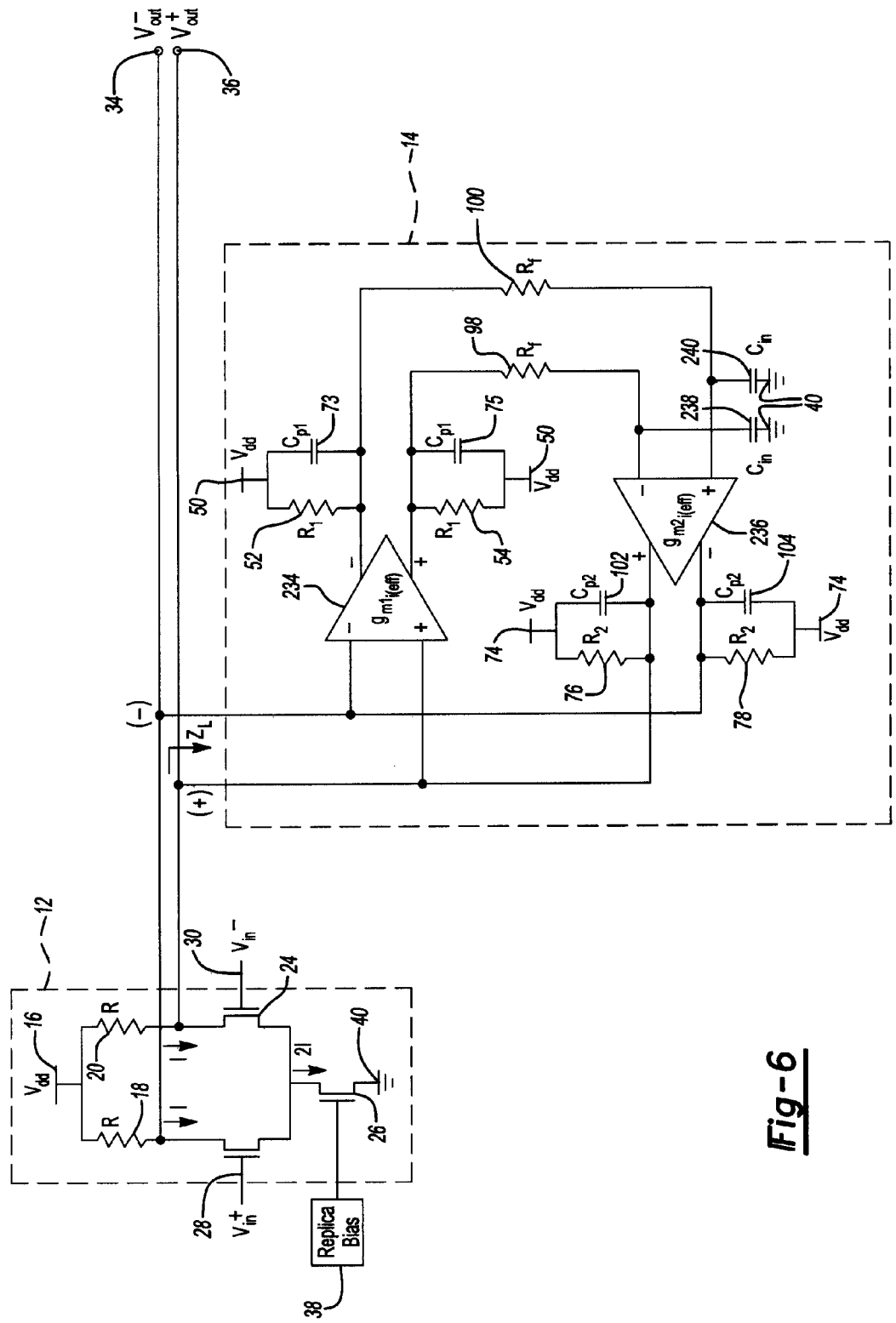
FIG. 6 is a schematic diagram of an example equivalent representation of the linear equalizer system of FIG. 1.

FIG. 6 is a schematic diagram of an example equivalent representation of the linear equalizer system of FIG. 1. Active inductor 14 has been redrawn to include $g_{m1i(eff)}$ 234 and $g_{m2i(eff)}$ 236. Parasitic capacitances associated with the inputs to $g_{m2i(eff)}$ are represented as capacitors 238, 240.

Figure 7:
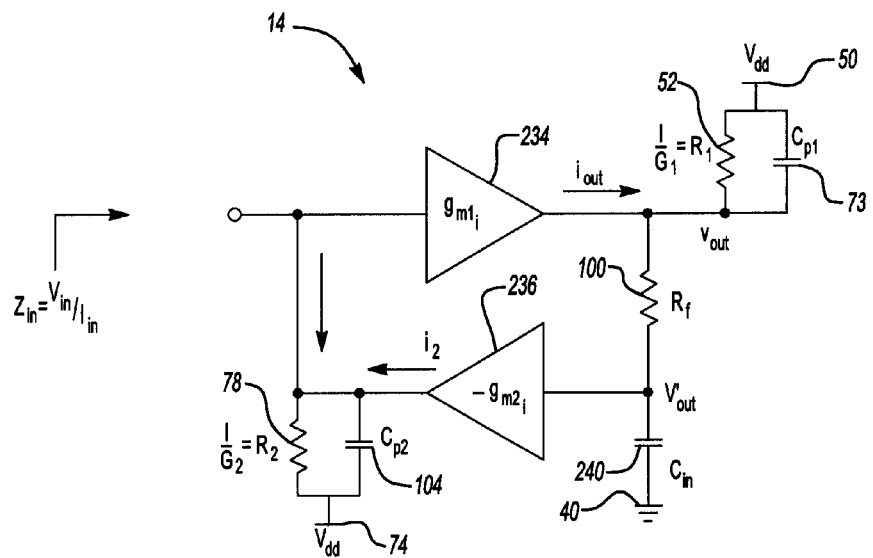
FIG. 7 is a schematic diagram of an example small signal equivalent representation of the active inductor of FIG. 6.

FIG. 7 is a schematic diagram of an example small signal equivalent representation of the active inductor of FIG. 6. The small signal analysis of equations (16)-(25) show active inductor 14 to have two tunable transconducting cells:

$$i_{out} = g_{m1_i}V_{in} \quad (16)$$

$$V_{out}(G_1 + sC_{p1}) + \frac{V_{out}}{R_f + \frac{1}{sC_{in}}} = i_{out} \quad (17)$$

$$V'_{out} = \frac{V_{out}sC_{in}}{1 + sC_{in}R_f} \cdot \frac{1}{sC_{in}} = \frac{V_{out}}{1 + sC_{in}R_f} \quad (18)$$

(17) and (18) yield $$V'_{out}(1 + sC_{in}R_f)\left[(G_1 + sC_{p1}) + \frac{sC_{in}}{1 + sC_{in}R_f}\right] = g_{m1_i}V_{in} \quad (19)$$

$$i_2 = g_{m2_i}V'_{out} \quad (20)$$

-continued $$i_{in} = V_{in}(G_2 + sC_{p2}) + g_{m2_i}V'_{out} \quad (21)$$

$$i_{in} = V_{in}(G_2 + sC_{p2}) + g_{m2_i}g_{m1_i}\frac{V_{in}}{(1 + sC_{in}R_f)(G_1 + sC_{p1}) + sC_{in}} \quad (22)$$

(22) yields $$Z_{in} = \frac{V_{in}}{i_{in}} = \frac{1}{(G_2 + sC_{p2}) + \frac{g_{m2_i}g_{m1_i}}{(1 + sC_{in}R_f)(G_1 + sC_{p1}) + sC_{in}}} \quad (23)$$

$$Z_{in} = \frac{(1 + sC_{in}R_f)(G_1 + sC_{p1}) + sC_{in}}{(G_2 + sC_{p2})(1 + sC_{in}R_f)(G_1 + sC_{p1}) + sC_{in}(G_2 + sC_{p2}) - g_{m2_i}g_{m1_i}} \quad (24)$$

$$Z_{in} = \frac{\left\{\frac{1}{g_{m1_i}g_{m2_i}} \cdot (1 + sC_{in}R_f)(G_1 + sC_{p1}) + \frac{sC_{in}}{g_{m1_i}g_{m2_i}}\right\}}{\left\{\frac{(G_2 + sC_{p2})(1 + sC_{in}R_f)(G_1 + sC_{p1}) + sC_{in}(G_2 + sC_{p2})}{g_{m1_i}g_{m2_i}} + 1\right\}} \quad (25)$$

The zeros of (25) represent inductive behavior.

Figure 8:
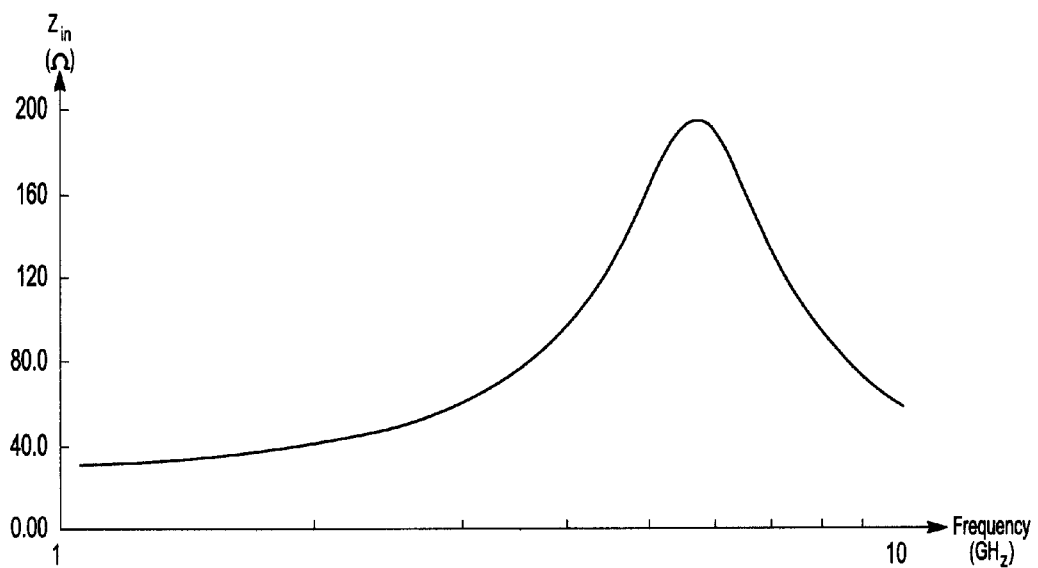
FIG. 8 is an example plot of the frequency response of the active inductor of FIG. 1.

As shown by (25), active inductor 14 is tunable via $g_{m1i}$, $g_{m2i}$ and $R_f$. For example, FIG. 8 is a plot of (25) using the values from Table 1. FIG. 8 shows input impedance, $Z_{in}$, with respect to frequency. The two zeros are set at lower frequencies than the poles of (25), thus yielding a frequency response that shows an inductive peaking at a particular frequency. This peak frequency, or resonance frequency, of active inductor 14 can be tuned via $g_{m1i}$, $g_{m2i}$ and $R_f$. The quality factor of active inductor 14 can also be tuned via $g_{m1i}$, $g_{m2i}$ and $R_f$.

Figure 9:
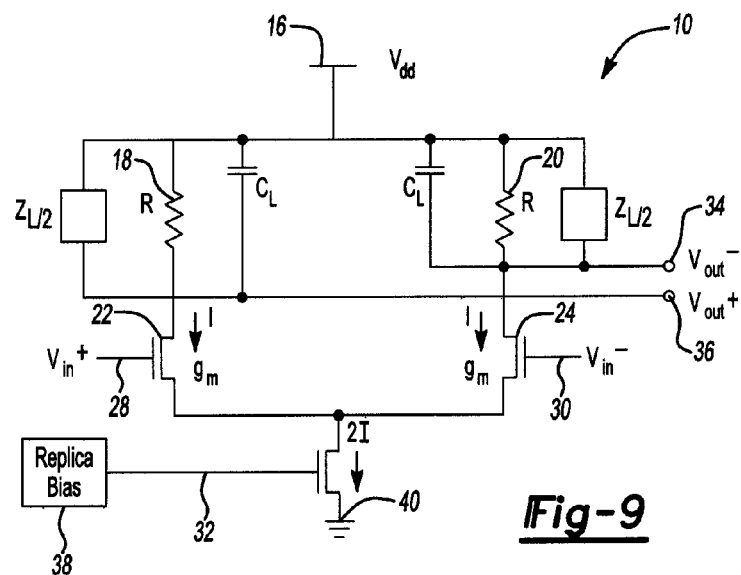
FIG. 9 is a schematic diagram of an another example equivalent representation of the linear equalizer system of FIG. 1.

A simplified schematic diagram of linear equalizer system 10 is shown in FIG. 9. Active inductor 14, represented as $Z_{L/2}$, is connected in parallel to the load resistor R and load capacitance $C_L$. The R and $C_L$ create the dominant pole of the equalizer while the active inductor $Z_{L/2}$ provides the zeros necessary to achieve gain peaking at the fundamental frequency, which is the half baud rate or data transmission rate.

Figure 10A:
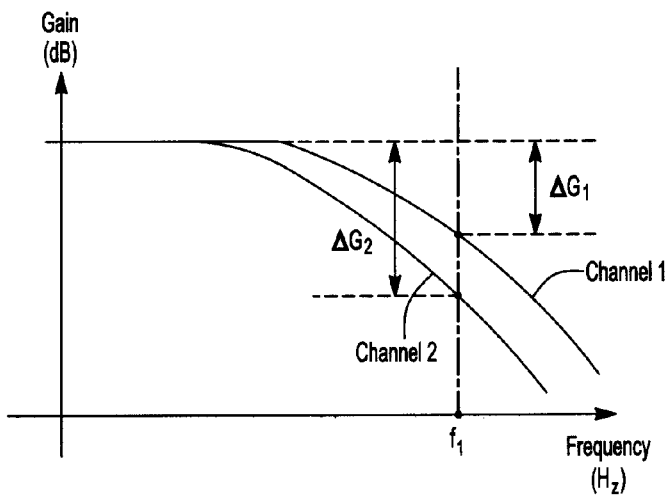
FIGS. 10A-10C are example plots of transfer characteristics.

FIG. 10A is an example plot of a transmission channel transfer characteristic. This transfer characteristic is similar to a low pass filter having attenuation at higher frequencies. Channel loss depends on channel characteristics such as channel length, trace material, and data transmission frequency. For example, the loss increases as the frequency increases. The loss through Channel 1 at the fundamental frequency, $f_1$, is $\Delta G_1$. The loss through Channel 2 at the fundamental frequency, $f_1$, is $\Delta G_2$. In the example of FIG. 10(a), for the same frequency, the loss through Channel 2 is more than the loss through Channel 1, e.g., $\Delta G_2 > \Delta G_1$.

Figure 10B:
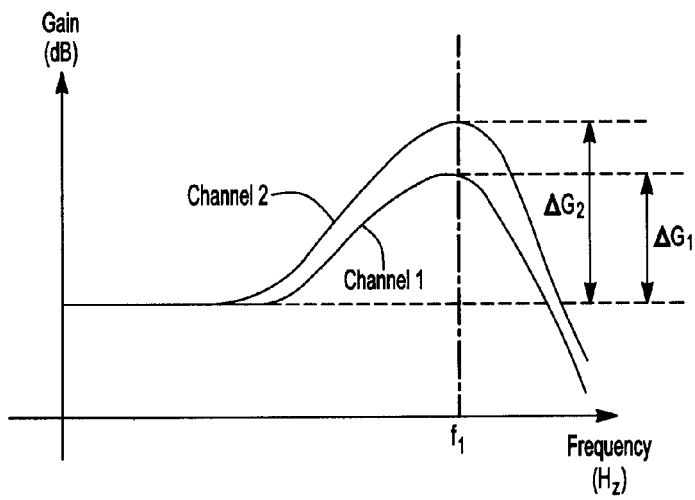
Figure 10C:
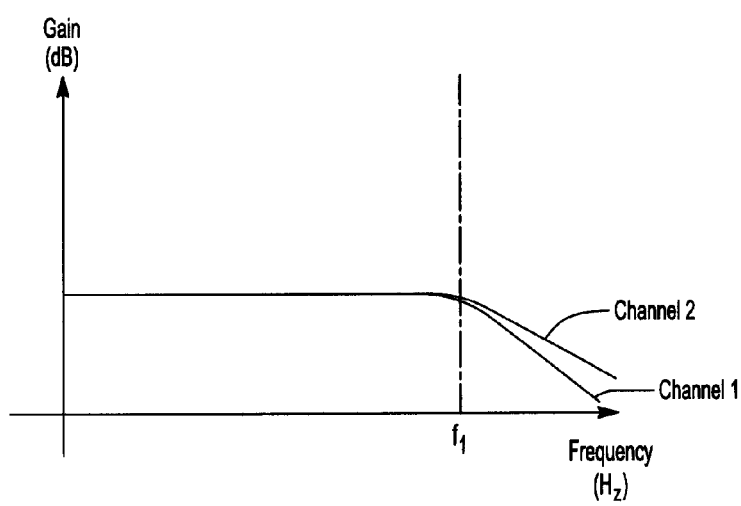

In order to compensate for the above channel loss, a linear equalizer at the receiving end is designed to have the transfer characteristics as shown in FIG. 10B. For Channel 1, at the fundamental frequency, the equalizer will have a peak gain of $\Delta G_1$. Similarly, for Channel 2, the equalizer will have a peak gain of $\Delta G_2$. The resulting transfer characteristic is shown in FIG. 10C. Signals carried by Channels 1 and 2 experience little loss up to the fundamental frequency, $f_1$, thereby equalizing the channel for data transmission.

Figure 11:
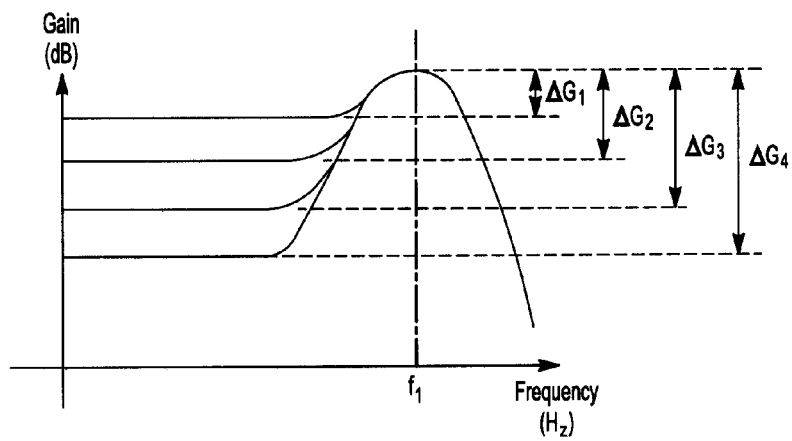
FIG. 11 is an example plot of transfer characteristics with different DC gains.

FIG. 11 is an example plot of transfer characteristics with different DC gains. By changing the gain, different amounts of equalization, e.g., $\Delta G_1$, $\Delta G_2$, $\Delta G_3$, $\Delta G_4$, are achieved.

Figure 12:
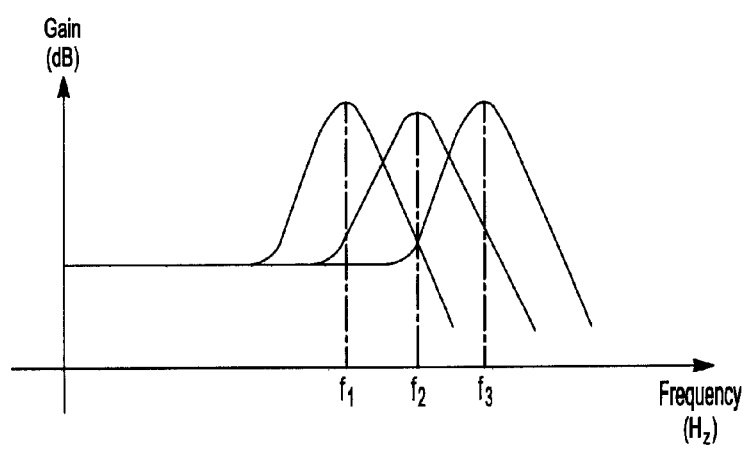
FIG. 12 is an example plot of the transfer characteristics of the linear equalizer system of FIG. 1.

FIG. 12 is an example plot of the transfer characteristics of the linear equalizer system of FIG. 1. By tuning the peak gain frequency, e.g., $f_1$, $f_2$, $f_3$, linear equalizer system 10 is able to operate at different data rates. Tuning the peak gain frequency may also correct peak gain frequency variations due to process, voltage and temperature conditions.

Figure 13:
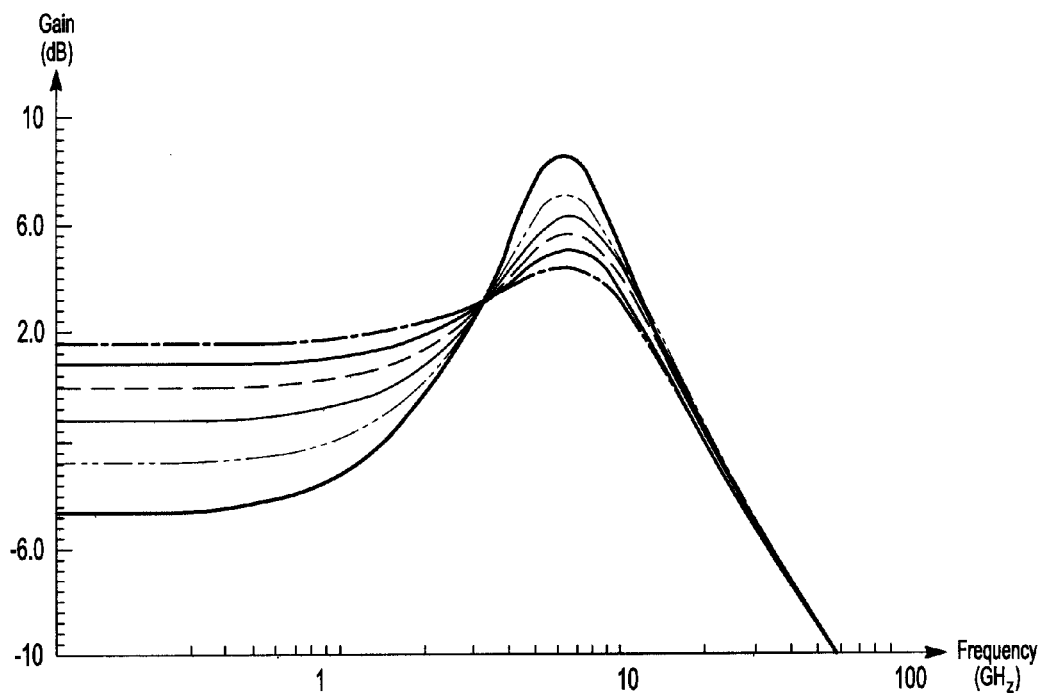
FIG. 13 is an example simulation result for the linear equalizer system of FIG. 1.

FIG. 13 is an example simulation result for the linear equalizer system of FIG. 1. As discussed above, linear equalizer system 10 may be tuned via $g_{m3}$ and $g_{m4}$. By tuning $g_{m3}$ and $g_{m4}$, the quality factor of active inductor 14 is altered. For example, for a certain peak gain frequency, the DC gain is tuned in the range of −5 dB (DAC 92 code 1111100) to 2 dB (DAC 92 code 0000000). As the DC gain is increased, the amount of equalization decreases.

Figure 14:
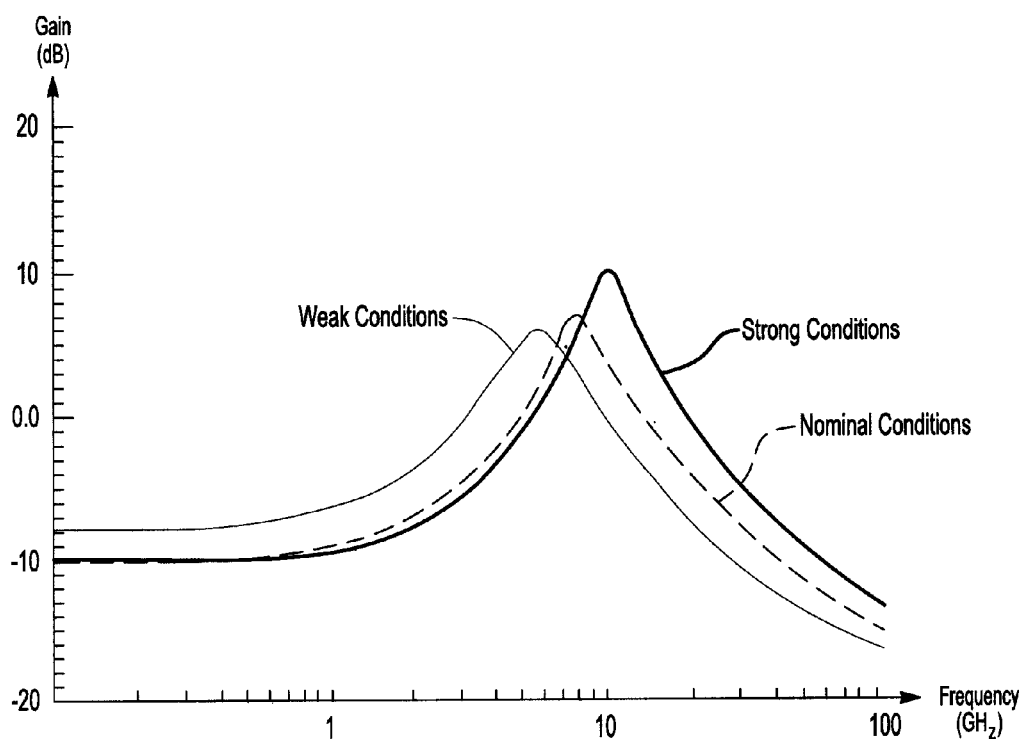
FIG. 14 is another example simulation result for the linear equalizer system of FIG. 1.

FIG. 14 is another example simulation result for the linear equalizer system of FIG. 1. The transfer characteristics are shown having peak gains at different frequencies because of process, temperature and voltage conditions. Desired transfer characteristics are to have a certain equalization, or gain peaking, at a fixed frequency at all corners. A desired frequency, for example, is 6 GHz for a 12 Gbps data rate.

In FIG. 14, for nominal, weak and strong conditions, the peak gain frequencies are respectively 7 GHz, 6 GHz and 10 GHz. Active inductor 14 may be tuned, for example, by using DAC 68 to correct the peak gain frequency for nominal and strong conditions.

Figure 15:
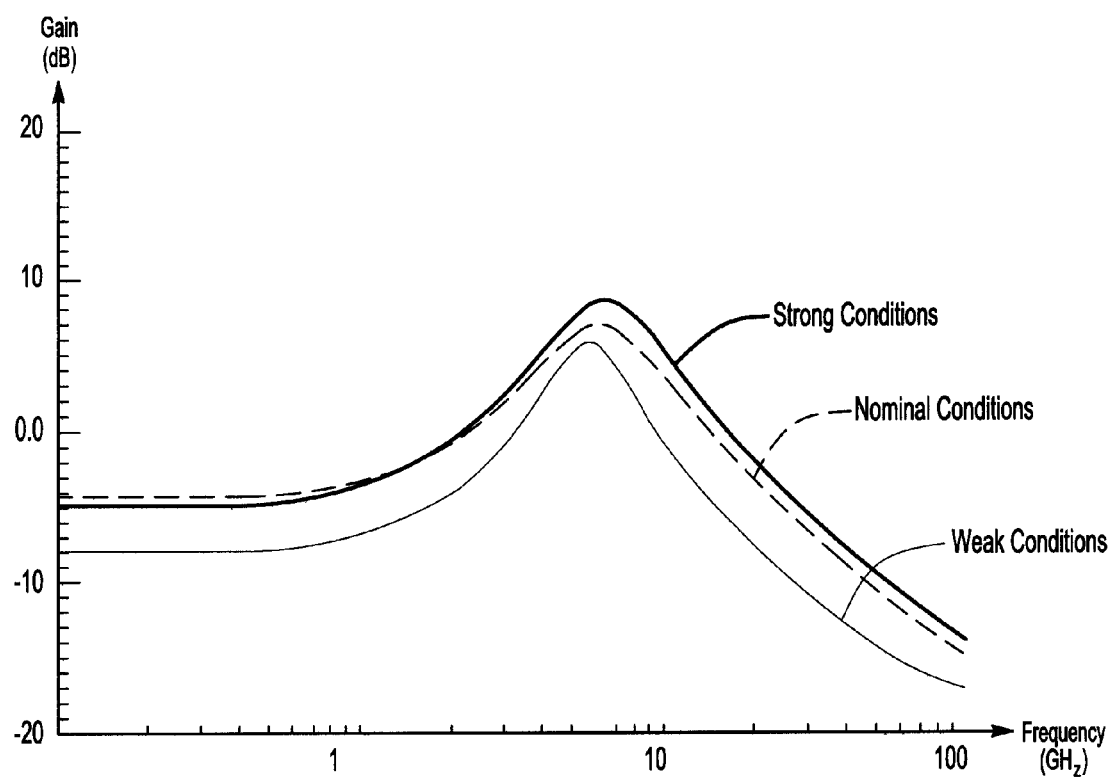
FIG. 15 is yet another example simulation result for the linear equalizer system of FIG. 1.

FIG. 15 is yet another example simulation result for the linear equalizer system of FIG. 1. Active inductor 14 was tuned to correct for the peak gain frequency for nominal and strong conditions. Example code for DAC 68 to correct for nominal condition variation is 1110000 and to correct for strong condition variation is 1100000.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A tunable active inductor system capable of receiving a bias current from a power supply, the system comprising:
   a first transconducting element, having a bias current sink, capable of being electrically connected with the power supply such that at least a portion of the bias current flows from the power supply to the bias current sink; and
   a digital to analog converter (DAC) being configured to tune the active inductor system by selectively controlling the flow of the bias current from the power supply to the bias current sink.

2. The system of claim 1 wherein the DAC is electrically connected, in parallel, with the bias current sink of the first transconducting element.

3. The system of claim 1 wherein the DAC includes a pair of NMOS transistors and wherein at least a portion of the bias current flows from the first transconducting element, through the pair of NMOS transistors, when activated, to ground.

4. The system of claim 3 wherein the first transconducting element further has a bias voltage source, wherein each of the pair of transistors has a respective gate, source, and drain, wherein the gate of one of the pair of transistors is electrically connected with the bias voltage source, the drain of the one of the pair of transistors is electrically connected with the bias current sink, and the source of the one of the pair of transistors is electrically connected with the drain of the other of the pair of transistors, and wherein the source of the other of the pair of transistors is electrically connected to the ground.

5. The system of claim 4 wherein the DAC further includes a binary to thermometer decoder having an n bit binary input and a $2^n$−1 bit thermometer code output and wherein one of the $2^n$−1 bit thermometer code outputs is electrically connected with the gate of the other of the pair of transistors.

6. The system of claim 1, wherein the first transconducting element further has a differential voltage output, further comprising a second transconducting element having a differential voltage input and a differential voltage output wherein the differential voltage output of the first transconducting element is electrically connected with at least one of the differential voltage input of the second transconducting element and the differential voltage output of the second transconducting element.

7. The system of claim 6, wherein the second transconducting element further has a bias current sink and wherein the second transconducting element is capable of being electrically connected with the power supply such that at least a portion of the bias current flows from the power supply to the bias current sink of the second transconducting element, further comprising a current steering device being electrically connected with the bias current sink of the second transconducting element and being configured to selectively control the flow of the bias current from the power supply to the bias current sink of the second transconducting element.

8. The system of claim 7 wherein the second current steering device comprises a digital to analog converter (DAC).

9. An active inductor system capable of receiving a bias current from a power supply, the system comprising:
   a first transconducting element, having a differential voltage output and a bias current sink, capable of being electrically connected with the power supply such that at least a portion of the bias current flows from the power supply to the bias current sink;
   a current steering device being configured to selectively control the flow of the bias current from the power supply to the bias current sink of the first transconducting element; and
   a second transconducting element having a differential voltage input wherein the differential voltage output of the first transconducting element is electrically connected with the differential voltage input of the second transconducting element through a series resistor with a predetermined resistance.

10. The system of claim 9 further comprising a third transconducting element having a differential voltage input and a differential voltage output wherein the differential voltage output of the first transconducting element is electrically connected with at least one of the differential voltage input of the third transconducting element and the differential voltage output of the third transconducting element.

11. The system of claim 9, wherein the second transconducting element further has a differential voltage output, further comprising a third transconducting element having a differential voltage input and a differential voltage output wherein the differential voltage output of the second transconducting element is electrically connected with at least one of the differential voltage input of the third transconducting element and the differential voltage output of the third transconducting element.

12. A linear equalizer system comprising:
   an amplifier;
   a power supply to provide a bias current; and
   an active inductor including
      a first transconducting element having a differential voltage input electrically connected with the amplifier, a differential voltage output, and a bias current sink, the first transconducting element being electrically connected with the power supply such that at least a portion of the bias current flows from the power supply to the bias current sink, and a current steering device being configured to selectively control the flow of the bias current from the power supply to the bias current sink of the first transconducting element.

13. The system of claim 12 wherein the current steering device comprises a digital to analog converter (DAC).

14. The system of claim 13 wherein the DAC is electrically connected, in parallel, with the bias current sink of the first transconducting element.

15. The system of claim 13 wherein the DAC includes a pair of NMOS transistors and wherein at least a portion of the bias current flows from the first transconducting element, through the pair of NMOS transistors, when activated, to ground.

16. The system of claim 15 wherein the DAC further includes a binary to thermometer decoder having an n bit binary input and a $2^n-1$ bit thermometer code output.

17. The system of claim 16 wherein one of the n bit thermometer code outputs is electrically connected with one of the pair of NMOS transistors.

18. The system of claim 12 further comprising a second transconducting element, having a differential voltage input, a differential voltage output, and a bias current sink, being electrically connected with the power supply such that at least a portion of the bias current flows from the power supply to the bias current sink of the second transconducting element, wherein the differential voltage output of the first transconducting element is electrically connected with at least one of the differential voltage input of the second transconducting element and the differential voltage output of the second transconducting element.

19. The system of claim 18 further comprising a third transconducting element having a differential voltage input and a differential voltage output wherein the differential voltage output of the first transconducting element is electrically connected with at least one of the differential voltage input of the third transconducting element and the differential voltage output of the third transconducting element.

20. The system of claim 18 further comprising a third transconducting element having a differential voltage input and a differential voltage output wherein the differential voltage output of the second transconducting element is electrically connected with at least one of the differential voltage input of the third transconducting element and the differential voltage output of the third transconducting element.

* * * * *